United States Patent [19]

Chia

[11] Patent Number: 4,868,349
[45] Date of Patent: Sep. 19, 1989

[54] PLASTIC MOLDED PIN-GRID-ARRAY POWER PACKAGE

[75] Inventor: Chok J. Chia, Santa Clara, Calif.
[73] Assignee: National Semiconductor Corporation, Santa Clara, Calif.
[21] Appl. No.: 191,462
[22] Filed: May 9, 1988
[51] Int. Cl.⁴ .............................................. H01L 23/28
[52] U.S. Cl. .................................. 174/52.4; 174/16.3; 29/856
[58] Field of Search ............. 174/16.3, 52 FP, 52 PE, 174/52.4, 52.2; 357/81; 29/841, 855, 856

[56] References Cited

U.S. PATENT DOCUMENTS

| | | | |
|---|---|---|---|
| 3,585,272 | 6/1971 | Shatz | 174/52 FP |
| 3,930,114 | 12/1975 | Hodge | 174/52 FP |
| 4,618,739 | 10/1986 | Theobald | 174/52 FP |
| 4,677,526 | 6/1987 | Muehling | 174/52 FP X |
| 4,688,152 | 8/1987 | Chia | 361/408 |

Primary Examiner—Arthur T. Grimley
Assistant Examiner—David A. Tone
Attorney, Agent, or Firm—Gail W. Woodward; Lee Patch

[57] ABSTRACT

A molded pin-grid-array package includes a heat sink available at the face opposite to the pins. The heat sink is secured to a printed wiring board that has plated through holes therein that form the desired pin-grip-array and wires are secured in the holes to form the package pins. The heat sink covers an aperture in the board and the semiconductor die is secured to the heat sink inside the cavity thereby formed. After the semiconductor die is attached and the bonding pads connected to the metal traces on the board, the assembly is placed in a transfer mold. Plastic encapsulant is then transfer molded to encapsulate the semiconductor die and to extend flush with the heat sink to form a skirt around the periphery of the board. This leaves the molded package with an available heat sink face for efficient cooling after the package is mounted for ultimate use.

7 Claims, 1 Drawing Sheet

U.S. Patent   Sep. 19, 1989   4,868,349
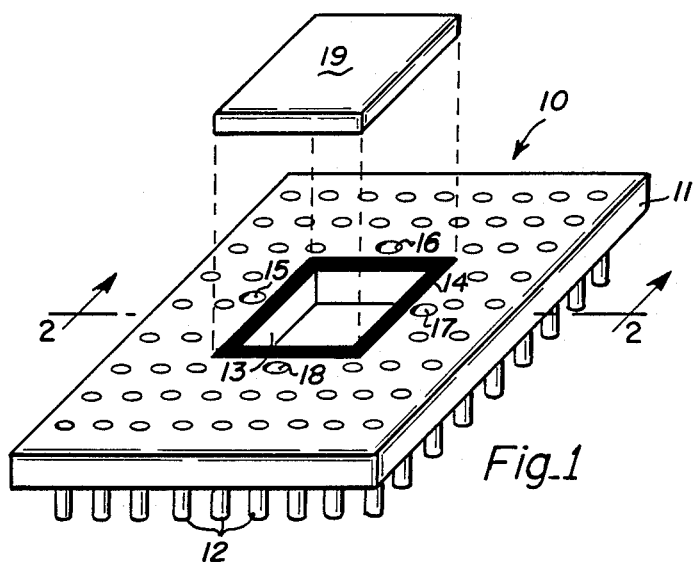
Fig_1
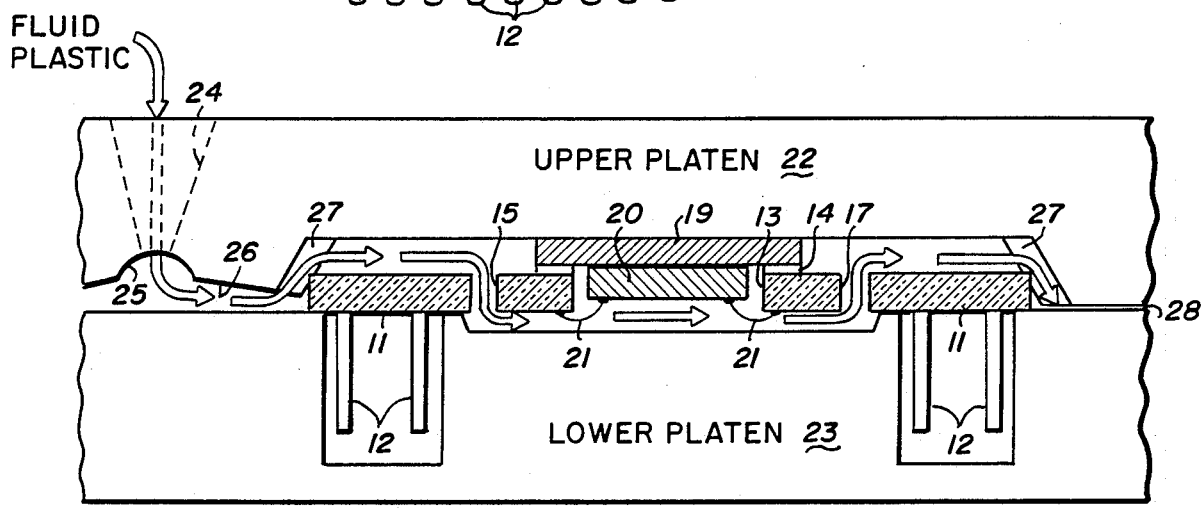
Fig_2
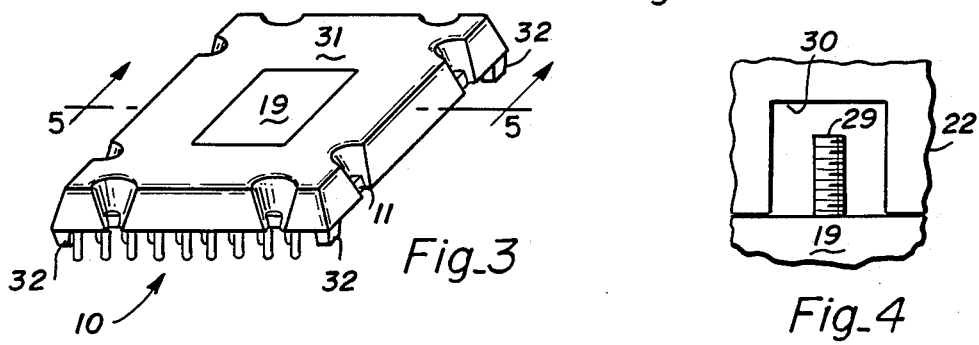
Fig_3
Fig_4
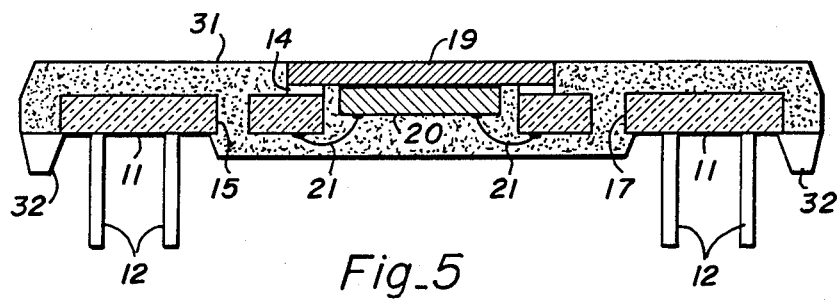
Fig_5

PLASTIC MOLDED PIN-GRID-ARRAY POWER PACKAGE

BACKGROUND OF THE INVENTION

The molded pin-grid-array package is disclosed and claimed in U.S. Pat. No. 4,688,152 which issued to applicant on Aug. 18, 1987. This patent is also assigned to the assignee of the present invention. The basic pin-grid-array concept involves a flat semiconductor housing with a large number of package pins extending from one face thereof in an array having standard spacing. Typically, several concentric rings of pins are involved with a total pin count ranging from 28 to 172 pins.

U.S. Pat. No. 4,688,152 discloses a basic printed wiring board (PWB) that contains a plurality of plated through holes. The package pins are soldered into the holes so as to extend in an array from one face thereof. The board contains a centrally located well in which an IC chip can be mounted and the IC bonding pads are connected to printed wiring traces that interconnect with the plated through holes. The board with its mounted and connected IC chip is then located in a molding cavity which has a series of ribs that locate the board inside the mold and press the pin side of the board against the mold. The other face of the board is then covered with transfer molded plastic that encapsulates the IC chip and the surface of the board. Since the board face is pressed against the mold on the pin containing side, plastic is precluded from that side and is confined to the other side of the board. A bead of plastic exists periphery in the form of a skirt around the edge of the board.

Where heat is generated by the IC chip, the above-described package does not remove the heat efficiently and is generally employed for housing only low power devices. The molded plastic encapsulant is not a good heat conductor and the PWB does not efficiently conduct heat. As a practical matter, most of the heat removed is by way of the package pins and, therefore, by way of the metal traces on the PWB.

SUMMARY OF THE INVENTION

It is an object of the invention to provide efficient heat removal in a plastic molded pin-grid-array package.

It is a further object of the invention to mount a heat sink on the printed wiring substrate to be used in a molded pin-grid-array package and to secure the active semiconductor device on the heat sink prior to molding.

These and other objects are achieved in the following manner. A PWB is prepared to have a plurality of package pins secured to extend from one face in the form of a pin-grid-array. The board has a cut-out region in its center and a copper heat sink is secured to the board to span the cut-out region on the opposite face of the board. The semiconductor device is then secured to the heat sink in the well created by the cut-out region. The bonding pads on the semiconductor device are then electrically connected to the traces on the printed wiring on the board that are joined to the array pins. This can be done by means of wire bonds or a tape assembly bonding (TAB) spider. The PW board is also provided with a plurality of holes located next to and outboard of the heat sink. The assembly is then located in a transfer mold composed of a pair of opposing platens. A first platen has a first cavity that accommodates the package pins and this cavity includes edges that bear against the printed wiring board adjacent to the pins. A second cavity is located in the first platen to span the holes in the board adjacent to the heat sink. The second or opposing platen has a cavity that spans the printed wiring board and is deep enough to accommodate the heat sink. It also contains a series of ribs that engage the printed wiring board so as to precisely locate it inside the platen and to press against the board periphery so as to force it against the first platen. It also contains runners and gates through which fluid plastic can be entered in a transfer molding operation. The fluid thereby transferred covers the board adjacent to the heat sink but is precluded from coating the heat sink by virtue of contact with the platen cavity face. The fluid plastic fills the platen cavity around the heat sink and also flows through the holes in the board thereby to cover the semiconductor device inside the second cavity located in the first platen. The mold also includes peripheral vents which act to relieve internal pressure buildup, but are too small to accommodate the flow of fluid plastic. Thus, the mold becomes filled with plastic which acts to encapsulate the printed wiring board and the housed semiconductor device. After transfer molding and partial cure of the encapsulant the device can be removed from the mold and the cure completed. After curing any flash is removed in the usual manner and the device is ready for use.

In the finished package, the heat sink surface is flush with the plastic surface and can be contacted in the usual ways for heat removal. If desired, some form of secondary cooling structure can be attached. For example, cooling fins can be attached to individual packages for air convection cooling. Where more than one package is to be cooled some form of cooling blanket can be placed in thermal contact with the devices. In an alternative embodiment a mounting stud is incorporated into the heat sink. This stud facilitates the attachment of a secondary cooling structure.

BRIEF DESCRIPTION OF THE DRAWING

FIG. 1 is an isometric view of a printed wiring board useful in practicing the invention and showing a heat sink that will be associated therewith.

FIG. 2 is a cross-section of a mold element that will be used to encapsulate a pin-grid-array with an attached heat sink and IC chip.

FIG. 3 is an isometric view of an encapsulated power package.

FIG. 4 is a fragmentary view of a portion of an alternative form of heat sink showing an attachment stud and a recess in the upper molding platen.

FIG. 5 is a cross-section of the structure of FIG. 3 taken at line 5—5.

DESCRIPTION OF THE INVENTION

With reference to FIG. 1 the starting element is a pin grid array package 10. Substrate 11 is a conventional PWB, typically of the multi-layer variety. It includes a series of plated through holes into which the package pins 12 are secured usually by soldering. While FIG. 1 shows a package containing 56 pins arrayed in two concentric rings; more or fewer pins, in other configurations, can be employed as desired. A hole 13 is cut through the center of the PWB and the hole ringed by metallization 14. Holes 15, 16, 17 and 18 also extend through the PWB and are located just outboard of metallization 14. It is to be understood that while four such holes are illustrated more or fewer can be employed. As a practical matter, only one such hole is necessary. The hole shape can be of any desired form. A heat sink 19 is secured to metallization 14, as shown by the arrows. Heat sink 19 is typically a slab of copper covered with a thin anticorrosion gold plate and is secured to metallization 14 by soldering. Alternatively, heat sink 19 can be attached by an adhesive. While not shown, PWB 11 includes conductive traces that join pins 12 to an array of traces on the pin side of the board that surround the periphery of hole 13. Also, while not shown, metallization 14, and therefore heat sink 19, is connected by a PWB trace to one or or more of pins 12.

Once heat sink 19 is secured to PWB 11 the package forms a cavity available from the pin side for mounting an IC chip. FIG. 2, which includes a sectional view of package 10, shows the package located between mold platens 22 and 23, which are employed in the transfer molding operation. FIG. 2 shows only a single position in the transfer mold which would ordinarily involve a plurality of such positions. A relatively large number of devices can be simultaneously molded. The transfer mold itself is conventional and is employed in a conventional transfer molding machine (not shown).

Prior to molding, IC chip 20 is attached to heat sink 19. This can be done by soldering or by the use of an adhesive. Then wires 21 are employed conventionally to connect the IC bonding pads to the traces located on PWB 11. This action connects the package pins 12 to the IC elements. Alternatively to the use of wires 19, which are oridinarily stitch bonded, a metal spider can be employed in an automated tape assembly bonding (TAB) structure.

In the molding operation a fluid (heated) plastic mixture is forced into hole 24. This material can be of the form disclosed in Sporck patent No. 3,838,094 which is also assigned to the assignee of the present invention. The arrows show the resulting plastic flow. The mold contains a runner 25 which connects hole 24 with a plurality of like molding positions. Each position is coupled to runner 25 by means of a gate 26. Here the plastic flows around heat sink 19 and over the upper surface of PWB 11. Holes 15-18 permit the plastic to flow between the two sides of PWB 11 so that the cavity in the lower platen 23 can receive encapsulant.

Ribs 27 hold the PWB 11 centered inside the mold and include faces that press PWB 11 against the lower mold platen 23. This feature is clearly disclosed in my U.S. Pat. No. 4,688,152. The upper platen 22 includes a cavity face that presses against heat sink 19 so as to preclude the entry of plastic over the upper portion of the heat sink. In the transfer molding art it is a good rule of thumb that the fluid plastic will not flow into a recess smller than about 0.025 mm. Thus, a vent shown at 28 having a thickness of about 0.01 mm will relieve air pressure within the mold while precluding the flow of plastic.

The lower mold platen 23 also contains recesses (not shown in FIG. 2) located at the four corners of PWB 11. Thus, the plastic can form protruding lips on the four corners of the package periphery. The finished molded power pin-grid-array is shown in FIG. 3. FIG. 5 is a cross-section of the finished product. The molded plastic is shown in cross-section as stippled in FIG. 5. It can be seen that lips 32 extends downward so that when the package is mounted on a conventional PWB it will seat with the lip in contact while the central portion of the structure will clear the board surface. Since lips 32 are located at the four corners of the package the central region is accessible to cleaning fluid after the pin-grid-array is soldered in final assembly.

Referring back to FIG. 2, it is to be understood that while heat sink 19 is shown as a flat slab, it can take other forms. For example, an integral threaded boss 29 can be included as shown in FIG. 4. Such a boss can facilitate the attachment of heat fins or some other form of cooling mechanism. When such a boss is present on heat sink 19 the upper mold platen 22 will contain an accommodating recess shown in at 30. Whether or not such a boss and recess is present, the close spacing between heat sink 19 and platen 22 around the periphery of the heat sink will preclude plastic from the heat sink face during molding.

The addition of the power capabilty to the molded pin-grid-array structure has been found to increase the IC power handling by about 10 times. In evaluating performance a microprocessor IC chip was mounted in the only other available equivalent power housing which is composed of ceramic. Such a ceramic housing costs about twice as much to produce and, because of the high ceramic dielectric constant, the microprocessor runs about 30% slower than it does in the power molded pin-grid-array package.

The invention has been described and its implementation detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A molded pin-grid-array power package comprising:
   a printed wiring board having plated through holes and including a plurality of package pins secured therein to extend from a first face to form a pin grid array;
   said printed wiring board having a central aperture and a heat sink plate attached to the second face thereof around the periphery of said aperture;
   said printed wiring board including access means extending therethrough between said first face and said second face and further including a printed wiring pattern whereby said pins in said array have electrical extensions that form an array of traces surrounding said aperture;
   a semiconductor die attached to said heat sink within said aperture, said die having an array of bonding pads;
   means for electrically connecting said bonding pads on said die to said array of traces whereby said pins are electrically connected to said semiconductor die;
   a molded plastic encapsulant covering said second face of said board and extending flush with the surface of said heat sink to surround the edges of said printed wiring board; and
   an extension of said molded plastic encapsulant located on said first face of said printed wiring board and extending through said access means and over said first face to overlap said aperture and thereby encapsulate said semiconductor die and the connections thereto.

2. The package of claim 1 wherein said access means is in the form of at least one hole in said printed wiring board outboard of said heat sink.

3. The package of claim 1 wherein said heat sink is soldered to metallization on said printed wiring board and thereby connected to at least one of said package pins.

4. The package of claim 1 wherein said heat sink plate includes means for attaching cooling means thereto.

5. The process for forming a molded pin grid array power package comprising the steps:

forming a printed wiring board to have plated through holes and a central aperture extending through said board;

securing package pins in said plated through holes to form a pin grid array extending in a pattern from one face of said board;

forming a heat sink plate of a thermally conductive material and having a size slightly greater than said aperture;

securing said heat sink plate to said board so as to cover said aperture on the other face of said board;

forming access means that extends through said board at a location inside said pin grid array and outside the edge of said heat sink plate;

attaching a semiconductor die to said heat sink in the cavity formed by said aperture and said heat sink plate;

electrically connecting the bonding pads on said die to conducting traces on said board; and molding a plastic encapsulant on said board to encapsulate said semiconductor die by way of said access means and to extend flush with said heat sink plate on said board outward to form a lip around the periphery of said board.

6. The process of claim 5 wherein said aperture is surrounded by metallization that is connected to at least one package pin and said heat sink is conductively secured to said metallization.

7. The process of claim 5 wherein said heat sink plate is formed to include means for attaching cooling elements thereto.

* * * * *